(12) United States Patent
Xu

(10) Patent No.: US 11,397,211 B2
(45) Date of Patent: Jul. 26, 2022

(54) ACQUIRING METHOD AND DEVICE OF RESIDUAL ENERGY OF POWER BATTERY

(71) Applicant: CONTEMPORARY AMPEREX TECHNOLOGY CO., LIMITED, Ningde (CN)

(72) Inventor: Guangyu Xu, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/563,264

(22) Filed: Dec. 28, 2021

(65) Prior Publication Data
US 2022/0206073 A1    Jun. 30, 2022

Related U.S. Application Data

(63) Continuation of application No. PCT/CN2020/139187, filed on Dec. 24, 2020.

(51) Int. Cl.
*G01R 31/36* (2020.01)
*G01R 31/396* (2019.01)
(Continued)

(52) U.S. Cl.
CPC .......... *G01R 31/3646* (2019.01); *B60L 58/12* (2019.02); *G01R 31/3648* (2013.01);
(Continued)

(58) Field of Classification Search
CPC ............. G01R 31/36; G01R 31/3646; G01R 31/3648; G01R 31/3828; G01R 31/396;
(Continued)

(56) References Cited

U.S. PATENT DOCUMENTS 5,483,165 A * 1/1996 Cameron ................ B60L 58/22
340/636.15
7,489,106 B1 * 2/2009 Tikhonov ................ B60L 58/15
320/120
(Continued)

FOREIGN PATENT DOCUMENTS

CN   106329021 A   1/2017
CN   107356874 A   11/2017
(Continued)

OTHER PUBLICATIONS

International Search Report dated May 28, 2021 issued in PCT/CN2020/139187.
Written Opinion dated May 28, 2021 issued in PCT/CN2020/139187.

*Primary Examiner* — Tung S Lau
(74) *Attorney, Agent, or Firm* — Scully Scott Murphy & Presser

(57) ABSTRACT

An acquiring method and device of residual energy of a power battery are provided. The acquiring method includes: acquiring an available capacity of a first type of cells and an available capacity of a second type of cells; determining a minimum available capacity as an available capacity of the power battery; determining available energy of the first type of cells according to the available capacity of the power battery, a current temperature, and a quantity of cells of the first type of cells; determining available energy of the second type of cells according to the available capacity of the power battery, a current temperature, and a quantity of cells of the second type of cells; and determining the sum of the available energy of the first type of cells and the available energy of the second type of cells as a quantity of residual energy of the power battery.

18 Claims, 3 Drawing Sheets

(51) Int. Cl.
*H01M 10/48* (2006.01)
*B60L 58/12* (2019.01)
*G01R 31/3828* (2019.01)
*G01R 31/392* (2019.01)
*H01M 10/42* (2006.01)

(52) U.S. Cl.
CPC ....... *G01R 31/3828* (2019.01); *G01R 31/396* (2019.01); *H01M 10/482* (2013.01); *G01R 31/392* (2019.01); *H01M 2010/4271* (2013.01); *H01M 2220/20* (2013.01)

(58) Field of Classification Search
CPC .... G01R 31/392; B60L 58/12; H01M 10/482; H01M 2010/4271; H01M 2220/20
See application file for complete search history.

(56) References Cited

U.S. PATENT DOCUMENTS

| | | | | |
|---|---|---|---|---|
| 9,139,103 | B2* | 9/2015 | Blakemore | B60L 58/22 |
| 9,337,680 | B2* | 5/2016 | Gibeau | B60L 53/52 |
| 10,732,225 | B2 | 8/2020 | Yun et al. | |
| 11,275,118 | B2* | 3/2022 | Miftahullatif | H01M 50/20 |
| 2011/0130986 | A1* | 6/2011 | Plett | H01M 10/48 |
| | | | | 324/427 |
| 2013/0066573 | A1* | 3/2013 | Bond | G01R 31/392 |
| | | | | 324/426 |
| 2014/0265554 | A1* | 9/2014 | Yang | B60L 3/0046 |
| | | | | 307/9.1 |
| 2015/0204948 | A1* | 7/2015 | Karoui | G01R 31/389 |
| | | | | 429/158 |
| 2015/0323610 | A1* | 11/2015 | Ahn | B60L 58/16 |
| | | | | 320/152 |
| 2016/0252583 | A1 | 9/2016 | Joe | |
| 2016/0380315 | A1* | 12/2016 | Weicker | H02J 7/1423 |
| | | | | 320/136 |
| 2017/0219657 | A1 | 8/2017 | Vovos | |
| 2017/0261561 | A1* | 9/2017 | Imamura | H01M 10/48 |
| 2017/0310120 | A1* | 10/2017 | Birkl | H02J 7/00714 |
| 2018/0106867 | A1 | 4/2018 | Yun et al. | |
| 2020/0319257 | A1 | 10/2020 | Yun et al. | |
| 2020/0376968 | A1 | 12/2020 | Wang et al. | |

FOREIGN PATENT DOCUMENTS

| | | |
|---|---|---|
| CN | 109742818 A | 5/2019 |
| CN | 110376535 A | 10/2019 |
| JP | 2006162402 A | 6/2006 |

* cited by examiner

ACQUIRING METHOD AND DEVICE OF RESIDUAL ENERGY OF POWER BATTERY

CROSS-REFERENCE TO RELATED APPLICATIONS

This application is a continuation of International Application No. PCT/CN2020/139187, filed on Dec. 24, 2020, the disclosure of which is hereby incorporated by reference in its entirety.

TECHNICAL FIELD

The present application relates to the technical field of batteries, and in particular relates to an acquiring method and device of residual energy of a power battery.

BACKGROUND

Power batteries are widely used to supply energy for electric equipment (e.g., electric automobiles, electric motorcycles and other electric vehicles). Due to limited capacity of the power batteries, it is necessary to monitor residual energy of the power batteries in real time.

In the prior art, generally, energy estimation can only be made for a power battery pack merely with a single type of cells, for a power battery with multiple types of cells, because the imbalance of different types of cells will affect the residual energy, energy of the power battery with multiple types of cells cannot be estimated by the same way as the battery pack merely with a single type of cells. Therefore, there lacks a solution to effectively and accurately acquire residual energy of a power battery with multiple types of cells in the prior art.

SUMMARY

The object of the present application is to provide an acquiring method and device of residual energy of a power battery, for the purpose of effectively and accurately acquiring the residual energy of a power battery with multiple types of cells.

As the first aspect, the present application provides an acquiring method of residual energy of a power battery, where the power battery includes a first type of cells and a second type of cells, and the first type of cells and the second type of cells are made from different materials, the acquiring method includes: acquiring an available capacity of the first type of cells and an available capacity of the second type of cells; determining a minimum available capacity of the available capacity of the first type of cells and the available capacity of the second type of cells as an available capacity of the power battery; determining available energy of the first type of cells in accordance with the available capacity of the power battery, a current temperature and a quantity of cells of the first type of cells; determining available energy of the second type of cells in accordance with the available capacity of the power battery, a current temperature and a quantity of cells of the second type of cells; and determining the sum of the available energy of the first type of cells and the available energy of the second type of cells as residual energy of the power battery.

In the present application, compared with the prior art, as to a power battery with two types of cells, an available capacity of each type of cells is acquired, and a minimum available capacity of the available capacity of the two types of cells is determined as an available capacity of the power battery; available energy of each type of cells is respectively determined based on the available capacity; and the residual energy of the power battery is determined based on the available energy of the two types of cells. In the process of acquiring the residual energy of the power battery, as respective residual energy of different types of cells are determined separately, the imbalance of different types of cells that has an effect on the finally determined residual energy can be avoided, the residual energy of the power battery with two types of cells can be effectively and accurately acquired. In case a power battery has more than two types of cells, residual energy may be acquired by the method as same as that for acquiring residual energy of a power battery with two types of cells. Therefore, by virtue of this acquiring method, the residual energy of a power battery with multiple types of cells can be effectively and accurately acquired.

Combined with the first aspect, in the first possible implementation of the first aspect, the acquiring an available capacity of the first type of cells and an available capacity of the second type of cells includes: acquiring an available capacity of a first cell, and acquiring an available capacity of a second cell; and acquiring an available capacity of a third cell, and acquiring an available capacity of a fourth cell, where the first cell is a cell with the minimum capacity within the first type of cells; the second cell is a cell with a minimum state of charge within the first type of cells; the third cell is a cell with the minimum capacity within the second type of cells; and the fourth cell is a cell with a minimum state of charge within the second type of cells.

In the present application, by acquiring available capacity of two types of cells, namely, cells with the minimum capacity and cells with the minimum state of charge (two types of possible weakest cells), an available capacity of each of the two types of cells is acquired, and further the acquired available capacity may represent the available capacity of the weakest cells of the two types of cells.

Combined with the first possible implementation of the first aspect, in the second possible implementation of the first aspect, the determining a minimum available capacity of the available capacity of the first type of cells and the available capacity of the second type of cells as an available capacity of the power battery includes: determining a minimum available capacity among the available capacity of the first cell, the available capacity of the second cell, the available capacity of the third cell and the available capacity of the fourth cell as the available capacity of the power battery.

In the present application, by determining the minimum available capacity among the available capacity of all cells as the available capacity of the power battery, accuracy in determining the available capacity of the power battery is improved, and further accuracy in determining the residual energy is improved.

Combined with the preceding two possible implementations of the first aspect, in the third possible implementation of the first aspect, the determining available energy of the first type of cells in accordance with the available capacity of the power battery, a current temperature and a quantity of cells of the first type of cells includes: determining a use interval of the first cell and a use interval of the second cell respectively in accordance with the available capacity of the power battery, where the use interval is a use interval of a state of charge of a corresponding cell; determining available energy of the first cell in accordance with the use interval of the first cell and the current temperature, and determining available energy of the second cell in accordance with the use interval of the second cell and the current temperature; determining available energy of the first type of cells in accordance with the available energy of the first cell, the available energy of the second cell and the quantity of cells of the first type of cells; the determining available energy of the second type of cells in accordance with the available capacity of the power battery, a current temperature and a quantity of cells of the second type of cells includes: determining a use interval of the third cell and a use interval of the fourth cell respectively in accordance with the available capacity of the power battery; determining available energy of the third cell in accordance with the use interval of the third cell and the current temperature, and determining available energy of the fourth cell in accordance with the use interval of the fourth cell and the current temperature; and determining available energy of the second type of cells in accordance with the available energy of the third cell, the available energy of the fourth cell, and a quantity of cells of the second type of cells.

In the present application, by calculating the use interval of a state of charge of each cell, the available energy of each cell is determined based on the use interval and the current temperature and available energy of two types of cells is determined based on the available energy of each cell and quantities of cells of the two types of cells, accuracy in determining available energy of the two types of cells is improved.

Combined with the third possible implementation of the first aspect, in the fourth possible implementation of the first aspect, the determining available energy of the first type of cells in accordance with the available energy of the first cell, the available energy of the second cell and a quantity of cells of the first type of cells includes: acquiring the minimum available energy of the available energy of the first cell and the available energy of the second cell; and determining a product of the minimum available energy and a quantity of cells of the first type of cells as available energy of the first type of cells; and where the determining available energy of the second type of cells in accordance with the available energy of the third cell, the available energy of the fourth cell and a quantity of cells of the second type of cells includes: acquiring the minimum available energy of the available energy of the third cell and the available energy of the fourth cell; and determining a product of the minimum available energy and a quantity of cells of the second type of cells as available energy of the second type of cells.

In the present application, by use of the product of the minimum available energy and the quantity of cells, the available energy of each type of cells is determined.

Combined with the first aspect and any one of possible implementations of the first aspect, in the fifth possible implementation of the first aspect, the acquiring method also includes: determining second displayed available energy in accordance with the quantity of residual energy and first displayed available energy, where the first displayed available energy is displayed available energy of a current period, and the second displayed available energy is displayed available energy of a next period; and sending the second displayed available energy to a controller.

In the present application, by updating the displayed available energy of a next period in real time through the residual energy of the power battery, sudden changes of display energy are reduced so as to avoid various influences caused by the sudden changes of the displayed energy.

Combined with the fifth possible implementation of the first aspect, in the sixth possible implementation of the first aspect, determining second displayed available energy in accordance with the residual energy and first displayed available energy includes: determining second displayed available energy in accordance with the residual energy, the first displayed available energy and an energy change rate.

In the present application, displayed available energy is made more accurate in combination with the energy change rate.

Combined with the sixth possible implementation of the first aspect, in the seventh possible implementation of the first aspect, if the power battery is in a charging state within the current period, the determining second displayed available energy in accordance with the residual energy, the first displayed available energy and an energy change rate includes:

if $Energy_1 + k_1 * Energy_{rate} > Energy_{real}$, $Energy_2 = Energy_1 + k_1 * Energy_{rate}$; or, if $Energy_1 + k_2 * Energy_{rate} < Energy_{real}$, $Energy_2 = Energy_1 + k_2 * Energy_{rate}$; or, if $Energy_1 + k_2 * Energy_{rate} \geq Energy_{real}$, $Energy_2 = Energy_{real}$;

where $Energy_1$ represents the first displayed available energy, $Energy_{rate}$ represents the energy change rate, $k_1 < 1$, $k_2 > 1$, $Energy_{real}$ represents the residual energy, and $Energy_2$ represents the second displayed available energy.

In the present application, by analyzing different energy conditions in a charging state, the displayed available energy of a next period can be effectively determined.

Combined with the sixth possible implementation of the first aspect, in the eighth possible implementation of the first aspect, if the power battery is in a discharging state within the current period, the determining second displayed available energy in accordance with the residual energy, the first displayed available energy and an energy change rate includes:

if $Energy_1 - k_3 * Energy_{rate} > Energy_{real}$, $Energy_2 = Energy_1 - k_3 * Energy_{rate}$; or, if $Energy_1 - k_4 * Energy_{rate} < Energy_{real}$, $Energy_2 = Energy_1 - k_4 * Energy_{rate}$; or, if $Energy_1 + k_4 * Energy_{rate} \geq Energy_{real}$, $Energy_2 = Energy_{real}$;

where $Energy_1$ represents the first displayed available energy, $Energy_{rate}$ represents the energy change rate, $k_3 > 1$, $k_4 < 1$, $Energy_{real}$ represents the residual energy, and $Energy_2$ represents the second displayed available energy.

In the present application, by analyzing different energy conditions in a discharging state, the displayed available energy of a next period can be effectively determined.

As the second aspect, the present application provides a display method of energy, including: acquiring residual energy of a power battery; determining second displayed available energy in accordance with the residual energy and first displayed available energy, where the first displayed available energy is the displayed available energy of a current period, and the second displayed available energy is the displayed available energy of a next period; and sending the second displayed available energy to a controller.

In the present application, by updating the displayed available energy of a next period in real time through the residual energy of the power battery, sudden changes of displayed energy are reduced so as to avoid various influences caused by the sudden changes of the displayed energy.

As the fourth aspect, the present application provides a battery management system, including a processor; and a storage in communication connection with the processor, where the storage is stored with an instruction executable by the processor, the instruction is executed by the processor so that the processor can execute the acquiring method of residual energy of a power battery in the first aspect and any one of possible implementations of the first aspect; or execute the display method of energy in the second aspect.

As the fifth aspect, the present application provides an electric vehicle, including a power battery and the battery management system of the fourth aspect.

As the sixth aspect, the present application provides a readable storage medium, the readable storage medium is stored with an instruction, when the instruction is run by an processor, the acquiring method of residual energy of a power battery of the first aspect and any one of possible implementations of the first aspect is executed; or the display method of energy in the second aspect is executed.

BRIEF DESCRIPTION OF THE DRAWINGS

To explain the technical solutions of the embodiments of the present application more clearly, a brief introduction about drawings used in the embodiments of the present application will be given below. Apparently, the drawings described below are merely some embodiments of the present application, and those of ordinary skill in the art would obtain other drawings based on the drawings below without paying any creative effort.

Figure 1:
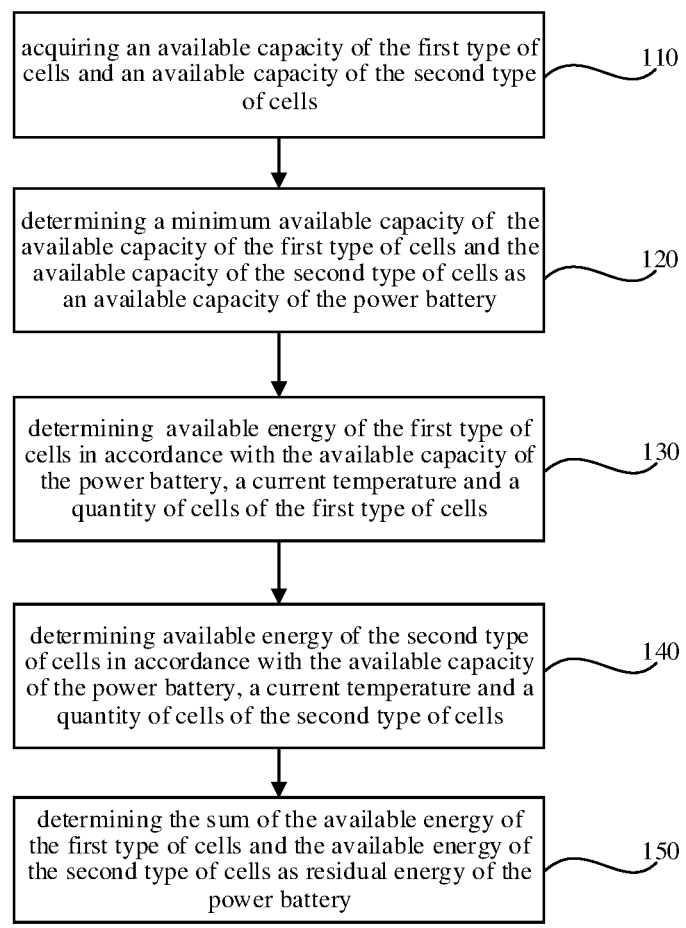
FIG. 1 is a flow chart of an acquiring method of residual energy of a power battery disclosed by an embodiment of the present application.

In the drawings, the figures are not necessarily drawn to scale.

The reference signs in the drawings denote: 300-acquiring device of residual energy of a power battery; 310-first acquiring module; 320-first processing module; 400-display device of energy; 410-second acquiring module; 420-second processing module; 430-sending module; 500-battery management system; 510-processor; 520-storage.

DESCRIPTION OF EMBODIMENTS

The present application will be described in detail in the following embodiments with reference to the appended drawings. The detailed description and drawings in the following embodiments are merely illustratively explaining the principle of the present application, instead of limiting the scope of the present application, i.e., the present application is not limited to the described embodiments.

In the description of the present application, it should be noted that, unless otherwise stated, the term "multiple" means more than two; all directional or positional relationships indicated by the terms including "upper", "lower", "left", "right", "inside", "outside", and the like are merely for the purpose of conveniently and simply describing the present application, instead of indicating or hinting the device or component referred to must have the particular orientation or be structured and operated at the particular orientation, and thus cannot be read to limitations to the present application. Besides, the terms "first", "second", "third" and the like are merely for descriptive purpose, and thus cannot be understood as indicating or hinting relative importance. The term "vertical" has an error allowable range instead of being vertical in the strict sense. The term "parallel" has an error allowable range instead of being parallel in the strict sense.

The nouns of locality mentioned below refer to the directions shown in the drawings, rather than limitations to the specific structure of the present application. In the present application, unless otherwise clearly stipulated, the terms "mount", "link", "connect" and the like should be understood in a broad sense, e.g., fixed connection, detachable connection or integral connection; or direct connection, or indirect connection via a medium. For those of ordinary skill in the art, its particular meanings can be understood depending on the particular contexts.

The acquiring method of residual energy of a power battery provided by the embodiment of the present application can be applied to electric vehicles, including electric automobiles, electric motorcycles and the like. Where the power battery of the electric vehicle includes at least two types of cells, and different types of cells are made from different materials.

Besides the electric vehicles, the acquiring method can also be applicable to other electric equipment (i.e., equipment using the power battery as a power supply), where the power battery of the electric equipment includes at least two types cells, and different types of cells are made from different materials.

No matter an electric vehicle or electric equipment, it is typically provided with a battery management system, the battery management system and the power battery constitute a battery system, the battery management system is used for management of the power battery, for example, management of various parameters such as battery state, battery capacity and the like. Therefore, the hardware environment in which the acquiring method is applied may refer to the battery management system corresponding to the power battery.

In addition to connection with the power battery to realize management of the power battery, the battery management system is also connected with other modules (including electric connection, physical connection or other implementable connection relationships) of electric vehicles or electric equipment. The battery management system can transmit data to these modules, for example, the battery management system of an electric vehicle sends energy information of the power battery to a vehicle control unit, and the vehicle control unit feeds back relevant parameter information (e.g., display). For another example, the battery management system receives a control instruction sent by the vehicle control unit and then manages the power battery accordingly based on the control instruction.

In the embodiment of the present application, SOC represents state of charge, and SOH represents state of health.

Referring to FIG. 1, it shows a flow chart of an acquiring method of residual energy of a power battery in an embodiment of the present application. The acquiring method includes Step 110, Step 120, Step 130, Step 140 and Step 150. Where Step 110: an available capacity of a first type of cells and an available capacity of a second type of cells are acquired.

Step 120 a minimum available capacity of the available capacity of the first type of cells and the available capacity of the second type of cells is determined as an available capacity of the power battery.

Step 130: available energy of the first type of cells is determined in accordance with the available capacity of the power battery, a current temperature and a quantity of cells of the first type of cells.

Step 140: available energy of the second type of cells is determined in accordance with the available capacity of the power battery, a current temperature and a quantity of cells of the second type of cells.

Step 150: the sum of the available energy of the first type of cells and the available energy of the second type of cells is determined as residual energy of the power battery.

In the embodiment of the present application, in the process of acquiring residual energy of the power battery, as respective residual energy of different types of cells is separately determined, imbalance of different types of cells that has an effect on the finally determined residual energy can be avoided. The residual energy of the power battery with two types of cells can be effectively and accurately acquired. Residual energy of a power battery with more than two types of cells can be acquired by referring to the method of acquiring residual energy of a power battery with two types of cells. Therefore, by virtue of this acquiring method, the residual energy of a power battery with multiple types of cells can be effectively and accurately acquired.

Step 110 to Step 150 will be explained in details in the following implementations.

In Step 110, the available capacity of the first type of cells may be the available capacity of weakest cells within the first type of cells, and the available capacity of the second type of cells may be the available capacity of weakest cells within the second type of cells. The weakest cell may be interpreted as a worse cell in each type of cells, or a cell having a larger effect on energy. No matter which type of cells is involved, the weakest cells include a cell with the minimum capacity (referring to the maximum available capacity), and a cell with the minimum state of charge.

Therefore, as an optional implementation, Step 110 includes: acquiring an available capacity of a first cell, and acquiring an available capacity of a second cell; and acquiring an available capacity of a third cell, and acquiring an available capacity of a fourth cell, where the first cell is a cell with the minimum capacity within the first type of cells; the second cell is a cell with the minimum state of charge within the first type of cells; the third cell is a cell with the minimum capacity within the second type of cells; and the fourth cell is a cell with the minimum state of charge within the second type of cells.

Where the maximum available capacity and state of charge of each cell can be calculated or monitored in real time by other modules in the battery management system. When energy estimation is needed, the maximum available capacity and state of charge of each cell can be directly acquired. Therefore, the battery management system is capable of directly determining the first cell, the second cell, the third cell and the fourth cell based on real-time parameter information.

After determination of the first cell, the second cell, the third cell and the fourth cell, an available capacity of the first cell, an available capacity of the second cell, an available capacity of the third cell and an available capacity of the fourth cell are acquired. As an optional implementation, the available capacity can be acquired through the following way:

$$C_1=(SOC_1-SOC_{1L})*SOH_1*C_{s1}, C_2=(SOC_2-SOC_{2L})*SOH_2*C_{s1}, C_3=(SOC_3-SOC_{3L})*SOH_3*C_{s2}, C_4=(SVC_4-SOC_{4L})*SOH_4*C_{s2}.$$

Where $C_{s1}$ represents a nominal capacity of the first type of cells, and $C_{s2}$ represents a nominal capacity of the second type of cells.

$C_1$ represents the available capacity of the first cell, $SOC_{1L}$ represents a use lower limit of a state of charge of the first cell, $SOC_1$ represents a current state of charge of the first cell, and $SOH_1$ represents a state of health of the first cell.

$C_2$ represents the available capacity of the second cell, $SOC_{2L}$ represents a use lower limit of a state of charge of the second cell, $SOC_2$ represents a current charge sate of the second cell, and $SOH_2$ represents a state of health of the second cell.

$C_3$ represents the available capacity of the third cell, $SOC_{3L}$ represents a use lower limit of a state of charge of the third cell, $SOC_3$ represents a current charge sate of the third cell, and $SOH_3$ represents a state of health of the third cell.

$C_4$ represents the available capacity of the fourth cell, $SOC_{4L}$ represents a use lower limit of a state of charge of the fourth cell, $SOC_4$ represents a current charge sate of the fourth cell, and $SOH_4$ represents a state of health of the fourth cell.

In the above parameters, the use lower limit (standard value (or desired value)) of a state of charge of a cell is a known parameter of the cell, which represents the minimum state of charge that the cell can reach. The current state of charge of a cell is information that is acquirable in real time, e.g., it is acquired from a state of charge estimation module of the battery management system. The state of health of a cell is also a known parameter of the cell. The nominal capacity of the first type of cells and the nominal capacity of the second type of cells are known parameters, and in or prior to manufacturing of the cell, they serve as manufacturing requirements of the cell.

By using the implementation, in Step 110, the available capacity of the first cell and the available capacity of the second cell are used as an available capacity of the first type of cells, and the available capacity of the third cell and the available capacity of the fourth cell are used as an available capacity of the second type of cells.

After acquiring the available capacity in Step 110, in Step 120, the minimum available capacity of the available capacity of the first type of cells and the available capacity of the second type of cells is determined as an available capacity of the power battery.

Combined with the implementation of Step 110, Step 120 may include: a minimum available capacity among the available capacity of the first cell, the available capacity of the second cell, the available capacity of the third cell and the available capacity of the fourth cell is determined as the available capacity of the power battery.

The minimum selection operation is represented as: $C_{pack}=Min(C_1,C_2,C_3,C_4)$, where $C_{pack}$ is the available capacity of the power battery.

After acquiring the residual energy of the power battery in Step 120, in Step 130, available energy of the first type of cells is determined in accordance with the available capacity of the power battery, the current temperature and the quantity of cells of the first type of cells; and in Step 140, available energy of the second type of cells is determined in accordance with the available capacity of the power battery, the current temperature and the quantity of cells of the second type of cells. It may be interpreted as that Step 130 and Step 140 may be carried out at the same time, or any of the two steps can be carried out at first, which is not limited in the embodiment of the present application.

As an optional implementation, Step 130 includes: determining a use interval of the first cell and a use interval of the second cell respectively in accordance with the available capacity of the power battery, where the use interval is a use interval of a state of charge of a corresponding cell; determining available energy of the first cell in accordance with the use interval of the first cell and the current temperature, and determining available energy of the second cell in accordance with the use interval of the second cell and the current temperature; determining available energy of the first type of cells in accordance with the available energy of the first cell, the available energy of the second cell and the quantity of cells of the first type of cells.

When the use interval of the first cell and the use interval of the second cell are determined, the actual use lower limit values of a state of charge of the first cell and the second cells may be determined at first, here the actual use lower limit value is different from the use lower limit desired value (or standard value) mentioned in the above embodiment. As an optional implementation, the actual value may be determined by the following way:

$$SOC_{1l}=SOC_1-C_p/(C_{s1}*SOH_1), SOC_{2l}=SOC_2-C_p/(C_{s1}*SOH_2).$$

where, $C_p$ represents the available capacity of the power battery, and $C_{s1}$ represents the nominal capacity of the first type of cells.

$SOC_{1l}$ represents the actual use lower limit value of a state of charge of the first cell, $SOC_1$ represents the current state of charge of the first cell, and $SOH_1$ represents the state of health of the first cell.

$SOC_{2l}$ represents the actual use lower limit value of a state of charge of the second cell, $SOC_2$ represents the current state of charge of the second cell, and $SOH_2$ represents the state of health of the second cell.

After determination of the actual use lower limit value of a state of charge, the use interval of the first cell is [$SOC_{1l}$, $SOC_1$], and the use interval of the second cell is [$SOC_{2l}$, $SOC_2$].

In the embodiment of the present application, it is allowed to preset the relationship among the use interval of a state of charge, the temperature and the available capacity, which can be recorded in a table form. In such a case, after the use interval is determined, table look-up may be carried out based on the use interval and the current temperature so as to determine the available energy corresponding to the use interval and the current temperature and then the corresponding available energy is used as the available energy of a corresponding cell. Where the relationship among the use interval of a state of charge, the temperature and the available energy can be determined through a great deal of experimental data or simulation data, which is not limited by the embodiment of the present application.

In the embodiment of the present application, it is also allowed to preset the relational expression among the use interval of a state of charge, the temperature and the available energy. As the use interval of a state of charge and the temperature are known, the available energy may be determined based on the relational expression. Where the relational expression may be set in combination with actual application scenes, which is however not limited by the embodiment of the present application.

After determining the available energy of the first cell and the available energy of the second cell through the above way, as an optional implementation, the determining available energy of the first type of cells includes: acquiring the minimum available energy of the available energy of the first cell and the available energy of the second cell; determining the product of the minimum available energy and the quantity of cells of the first type of cells as available energy of the first type of cells.

The implementation may be represented as: $E_1$=Min $(E_{1\_1}, E_{1\_2})*N_1$, where $E_1$ represents the available energy of the first type of cells, $N_1$ represents the quantity of cells of the first type of cells, $E_{1\_1}$ represents the available energy of the first cell, and $E_{1\_2}$ represents the available energy of the second cell.

When the use interval of the third cell and the use interval of the fourth cell are determined, the actual use lower limit values of a state of charge of the third cell and the fourth cell may be determined at first, and the actual use lower limit value is different from the use lower limit desired value (or standard value) mentioned in the above embodiment. As an optional implementation, the actual value may be determined by the following way:

$$SOC_{3l}=SOC_3-C_p/(C_{s2}*SOH_3), SOC_{4l}=SOC_4-C_p/(C_{s2}*SOH_4).$$

where $C_p$ represents the available capacity of the power battery, and $C_{s2}$ represents the nominal capacity of the second type of cells.

$SOC_{3l}$ represents the actual use lower limit value of a state of charge of the third cell, $SOC_3$ represents the current state of charge of the third cell, and $SOH_3$ represents the state of health of the third cell.

$SOC_{4l}$ represents the actual use lower limit value of a state of charge of the fourth cell, $SOC_4$ represents the current state of charge of the fourth cell, and $SOH_4$ represents the state of health of the fourth cell.

After determination of the actual use lower limit value of a state of charge, the use interval of the third cell is [$SOC_{3l}$, $SOC_3$], and the use interval of the fourth cell is [$SOC_{4l}$, $SOC_4$].

After determination of the use interval of the third cell and the use interval of the fourth cell, the implementation of determining available energy of the third cell and available energy of the fourth cell is as same as that of determining available energy of the first cell and available energy of the second cell, so no repetitive introduction is given.

After determining the available energy of the third cell and the available energy of the fourth cell, as an optional implementation, the determining available energy of the second type of cells includes: acquiring the minimum available energy of the available energy of the third cell and the available energy of the fourth cell; and determining the product of the less available energy and the quantity of cells of the second type of cells as available energy of the second type of cells.

The implementation may be represented as: $E_2$=Min $(E_{2\_1}, E_{2\_2})*N_2$, where $E_2$ represents the available energy of the second type of cells, $N_2$ represents the quantity of cells of the second type of cells, $E_{2\_1}$ represents the available energy of the third cell, and $E_{2\_2}$ represents the available energy of the fourth cell.

In the embodiment of the present application, by calculating the use interval of a state of charge of each cell, determining available energy of each cell based on the use interval and the current temperature and determining the available energy of two types of cells based on the available energy of each cell and the quantities of cells of the two types of cells, accuracy in determining available energy of two types of cells is improved.

After the available energy of the first type of cells and the available energy of the second type of cells are respectively determined in Step 130 and Step 140, in Step 150, the sum of the available energy of the first type of cells and the available energy of the second type of cells is determined as the residual energy of the power battery. That is, $Energy_{real}=E_1+E_2$, where $Energy_{real}$ represents the residual energy of the power battery.

In the explanations of the above embodiments, with regard to two types of cells of a power battery, in actual application, the type of cells of the power battery is not limited to two, and may be more than two. For example, in case the power battery also includes a third type of cells and the material of the third type of cells is different from that of the first type of cells and that of the second type of cells, the acquiring method of residual energy of a power battery includes:

acquiring an available capacity of the first type of cells, an available capacity of the second type of cells and an available capacity of the third type of cell; determining the minimum available capacity among the available capacity of the first type of cells, the available capacity of the second type of cells and the available capacity of the third type of cell as an available capacity of the power battery; determining the available energy of the first type of cells in accordance with the available capacity of the power battery, the current temperature and the quantity of cells of the first type of cells; determining the available energy of the second type of cells in accordance with available capacity of the power battery, the current temperature and the quantity of cells of the second type of cells; determining the available energy of the third type of cells in accordance with the available capacity of the power battery, the current temperature and the quantity of cells of the third type of cells; and determining the sum of the available energy of the first type of cells, the available energy of the second type of cells and the available energy of the third type of cells as the residual energy of the power battery.

Where regarding the method for acquiring the available capacity of the third type of cells, please refer to the method for acquiring the available capacity of the first type of cells and the available capacity the second type of cells; regarding the method for acquiring available energy of the third type of cells, please refer to the method for acquiring available energy of the first type of cells and available energy of the second type of cells. No repetition is given in this embodiment of the present application.

If the power battery also includes more types of cells, the acquiring method of residual energy of the power battery is performed in the same way, therefore, no more examples will be provided in the embodiment of the present application.

Figure 2:
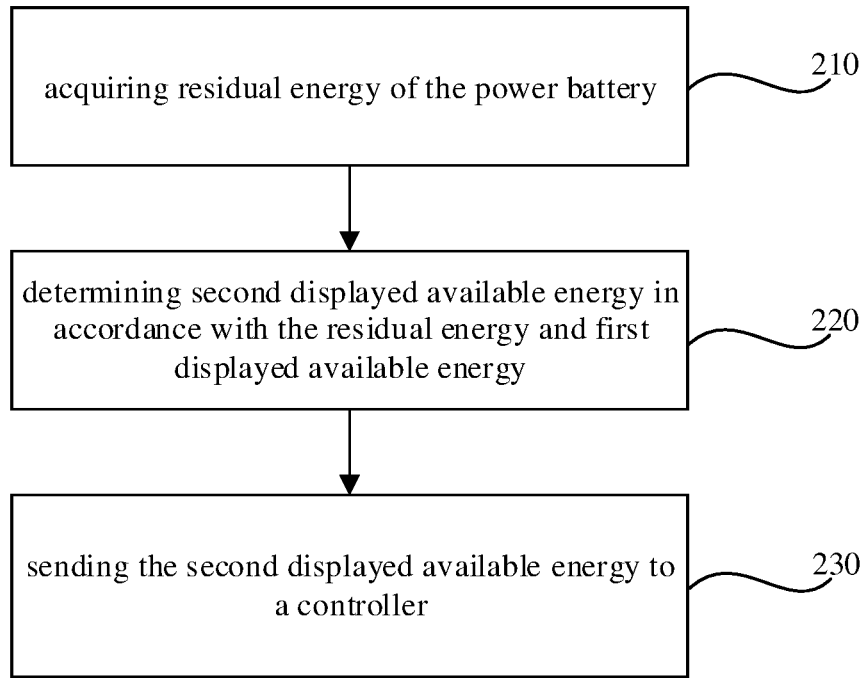
FIG. 2 is a flow chart of a display method of energy disclosed by an embodiment of the present application.

Referring to FIG. 2, the embodiment of the present application also provides a display method of energy, and the display method includes Step 210, Step 220 and Step 230.

Step 210: residual energy of a power battery is acquired.

Step 220: second displayed available energy is determined in accordance with the residual energy and first displayed available energy, where the first displayed available energy is the displayed available energy of a current period, and the second displayed available energy is the displayed available energy of a next period.

Step 230: the second displayed available energy is sent to a controller.

In the embodiment of the present application, by updating the displayed available energy of a next period in real time through the residual energy of the power battery, sudden changes of displayed energy are reduced so as to avoid various influences caused by the sudden changes of displayed energy.

The display method can be applicable to electric vehicles or other electric equipment. If the display method is applied to an electric vehicle, the controller in Step 230 is a vehicle control unit of the electric vehicle; and if the display method is applied to other electric equipment, the controller in Step 230 is a master controller of the electric equipment.

Besides, the hardware operation environment in which the display method is carried out still refers to the battery management system as introduced in the above embodiments.

In the embodiment of the present application, in case the display method is applied to an electric vehicle, by updating the displayed available energy in real time, a driver of the electric vehicle can timely understand the available energy of a next period, thereby avoiding influences caused by the sudden changes of display energy to the driver, for example, at the sight of sudden reduction of energy, the driver may feel worried even scared, and driving level of the driver may be influenced in severe case to lower security of the electric vehicle. Hence, the display method can improve the driving safety of the electric vehicle to some extent.

The display method may be incorporated into the procedure of the acquiring method of residual energy of a power battery provided by the embodiment of the present application (i.e., it may belong to the procedure of the acquiring method of residual energy of the power battery), or may be a separate method procedure.

If the display method is incorporated into the procedure of the acquiring method of residual energy of a power battery provided by the embodiment of the present application, the residual energy acquired in Step 210 is the residual energy of the power battery determined in Step 150. If the display method is a separate method procedure, the residual energy acquired in Step 210 is the residual energy determined by using the acquiring method of residual energy of a power battery provided by the embodiment of the present application, or the residual energy determined by using the acquiring method of residual energy provided by other embodiments, which is however not limited by the embodiment of the present application.

Besides, if the display method is a separate method procedure, the power battery used in the display method may be a power battery with a single type of cells, or a power battery with multiple types of cells, which is however not limited by the embodiment of the present application.

As an optional implementation, Step 220 includes: determining the second displayed available energy in accordance with the residual energy, the first displayed available energy and an energy change rate.

Where the energy change rate is represented as: $Energy_{rate}=\int U*IdT$, where $Energy_{rate}$ represents the energy change rate, U represents a real-time voltage value of the power battery, I represents a real-time current value of the power battery, both the real-time voltage value and the real-time current value can be directly acquired, and dT represents quadrature of time T.

In the embodiment of the present application, in accordance with different states of the power battery within the current period, Step 220 may adopt different implementations, and states of the current period include a charging state and a discharging state.

In case the power battery is in a charging state within the current period, Step 220 includes:

if $\text{Energy}_1+k_1*\text{Energy}_{rate}>\text{Energy}_{real}$,
   $\text{Energy}_2=\text{Energy}_1+k_1*\text{Energy}_{rate}$; or, if $\text{Energy}_1+k_2*\text{Energy}_{rate}<\text{Energy}_{real}$,
   $\text{Energy}_2=\text{Energy}_1+k_2*\text{Energy}_{rate}$; or, if $\text{Energy}_1+k_2*\text{Energy}_{rate}\geq\text{Energy}_{real}$,
   $\text{Energy}_2=\text{Energy}_{real}$;

where $\text{Energy}_1$ represents the first displayed available energy, $\text{Energy}_{rate}$ represents the energy change rate, $k_1<1$, $k_2>1$, $\text{Energy}_{real}$ represents the residual energy, and $\text{Energy}_2$ represents the second displayed available energy.

Where $k_1$ and $k_2$ represent gaps between the displayed energy and the actual energy, and can be also interpreted as the following rate of the displayed energy as compared with the actual energy. $k_1$ and $k_2$ may be preset fixed values that can be set based on requirements of a user. $k_1$ and $k_2$ may also be preset initial values that can be updated by the user based on own requirements in the following application process. Where the initial value may be 0 or a reasonable value stipulated by manufacturers of power batteries.

In case the power battery is in a charging state within the current period, Step 220 includes:

if $\text{Energy}_1-k_3*\text{Energy}_{rate}>\text{Energy}_{real}$,
   $\text{Energy}_2=\text{Energy}_1-k_3*\text{Energy}_{rate}$; or, if $\text{Energy}_1-k_4*\text{Energy}_{rate}<\text{Energy}_{real}$,
   $\text{Energy}_2=\text{Energy}_1-k_4*\text{Energy}_{rate}$; or, if $\text{Energy}_1-k_4*\text{Energy}_{rate}\geq\text{Energy}_{real}$,
   $\text{Energy}_2=\text{Energy}_{real}$;

where $\text{Energy}_1$ represents the first displayed available energy, $\text{Energy}_{rate}$ represents the energy change rate, $k_3>1$, $k_4<1$, $\text{Energy}_{real}$ represents the residual energy, and $\text{Energy}_2$ represents the second displayed available energy.

Where regarding meaning and implementations of $k_3$ and $k_4$, please refer to those of $k_1$ and $k_2$, which are not repeated in the embodiment of the present application.

After determination of the second displayed available energy in Step 220, in Step 230, the second displayed available energy is sent to the controller.

After receiving the second displayed available energy, the controller displays the second displayed available energy at the beginning of next period.

It should be understood that, the processes of Step 210-Step 230 are carried out in a cyclic manner in real time, that is, the battery management system determines the displayed available energy of each period in real time, and the controller displays the available energy of each period in real time.

Figure 3:
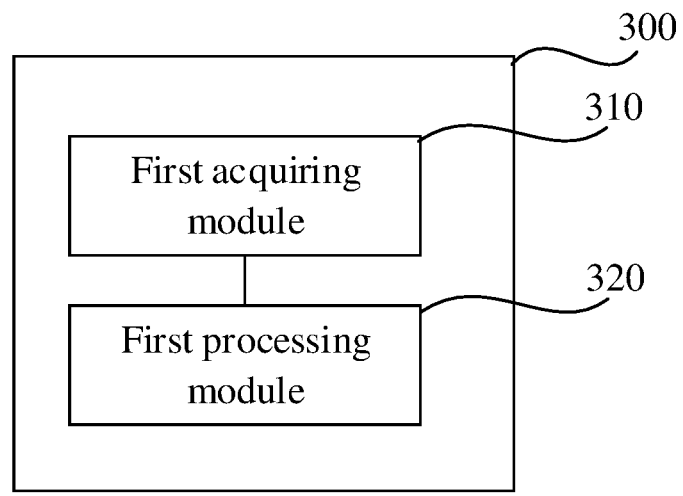
FIG. 3 is a structure diagram of an acquiring device of residual energy of the power battery disclosed by an embodiment of the present application.

Referring to FIG. 3, the embodiment of the present application also provides an acquiring device 300 of residual energy of a power battery, including a first acquiring module 310 and a first processing module 320.

The first acquiring module 310 is used for acquiring an available capacity of the first type of cells and an available capacity of the second type of cells.

The first processing module 320 is used for determining the minimum available capacity of the available capacity of the first type of cells and the available capacity of the second type of cells as an available capacity of the power battery, determining available energy of the first type of cells in accordance with the available capacity of the power battery, the current temperature and the quantity of cells of the first type of cells, determining available energy of the second type of cells in accordance with the available capacity of the power battery, the current temperature and the quantity of cells of the second type of cells, and determining the sum of the available energy of the first type of cells and the available energy of the second type of cells as residual energy of the power battery.

In the embodiment of the present application, the first acquiring module 310 is specially used for acquiring an available capacity of the first cell, and acquiring an available capacity of the second cell; acquiring an available capacity of the third cell, and acquiring an available capacity of the fourth cell, where the first cell is a cell with a minimum capacity within the first type of cells; the second cell is a cell with a lowest state of charge within the first type of cells; the third cell is a cell with a minimum capacity within the second type of cells; and the fourth cell is a cell with a lowest state of charge within the second type of cells.

In the embodiment of the present application, the first processing module 320 is specially used for determining the minimum available capacity among the available capacity of the first cell, the available capacity of the second cell, the available capacity of the third cell and the available capacity of the fourth cell as an available capacity of the power battery.

In the embodiment of the present application, the first processing module 320 is specially used for determining a use interval of the first cell and a use interval of the second cell respectively in accordance with the available capacity of the power battery, where the use interval is a use interval of a state of charge of a corresponding cell; determining available energy of the first cell in accordance with the use interval of the first cell and the current temperature, and determining available energy of the second cell in accordance with the use interval of the second cell and the current temperature; and determining available energy of the first type of cells in accordance with available energy of the first cell, available energy of the second cell and the quantity of cells of the first type of cells; and where the processing module is further specially used for determining a use interval of the third cell and a use interval of the fourth cell respectively in accordance with the available capacity of the power battery; determining available energy of the third cell in accordance with the use interval of the third cell and the current temperature, and determining available energy of the fourth cell in accordance with the use interval of the fourth cell and the current temperature; and determining available energy of the second type of cells in accordance with the available energy of the third cell, the available energy of the fourth cell and the quantity of cells of the second type of cells.

In the embodiment of the present application, the first processing module 320 is specially used for acquiring the minimum available energy of the available energy of the first cell and the available energy of the second cell; determining the product of the minimum available energy and the quantity of cells of the first type of cells as available energy of the first type of cells; and where the processing module is further specially used for acquiring the minimum available energy of the available energy of the third cell and the available energy of the fourth cell; and determining the product of the minimum available energy and the quantity of cells of the second type of cells as available energy of the second type of cells.

In the embodiment of the present application, the first processing module 320 is further used for determining second displayed available energy in accordance with the residual energy and first displayed available energy, where the first displayed available energy is displayed available energy of a current period; and the second displayed available energy is the displayed available energy of a next period; and sending the second displayed available energy to a controller.

In the embodiment of the present application, the first processing module 320 is specially used for determining the second displayed available energy in accordance with the residual energy, the first displayed available energy and an energy change rate.

In the embodiment of the present application, if the power battery is in a charging state within the current period, the first processing module 320 is specially used for:

if $Energy_1 + k_1*Energy_{rate} > Energy_{real}$,
$Energy_2 = Energy_1 + k_1*Energy_{rate}$; or, if $Energy_1 + k_2*Energy_{rate} < Energy_{real}$,
$Energy_2 = Energy_1 + k_2*Energy_{rate}$; or, if $Energy_1 + k_2*Energy_{rate} \geq Energy_{real}$,
$Energy_2 = Energy_{real}$;

where $Energy_1$ represents the first displayed available energy, $Energy_{rate}$ represents the energy change rate, $k_1 < 1$, $k_2 > 1$, $Energy_{real}$ represent the residual energy, and $Energy_2$ represents the second displayed available energy.

In the embodiment of the present application, if the power battery is in a discharging state within the current period, the first processing module 320 is specially used for:

if $Energy_1 - k_3*Energy_{rate} > Energy_{real}$,
$Energy_2 = Energy_1 - k_3*Energy_{rate}$; or, if $Energy_1 - k_4*Energy_{rate} < Energy_{real}$,
$Energy_2 = Energy_1 - k_4*Energy_{rate}$; or, if $Energy_1 - k_4*Energy_{rate} \geq Energy_{real}$,
$Energy_2 = Energy_{real}$;

where $Energy_1$ represents the first displayed available energy, $Energy_{rate}$ represents the energy change rate, $k_3 > 1$, $k_4 < 1$, $Energy_{real}$ represent the residual energy, and $Energy_2$ represents the second displayed available energy.

Each functional module of the acquiring device 300 of residual energy of a power battery as shown in FIG. 3 is in one-to-one correspondence to each step of the acquiring method of residual energy of a power battery as introduced in the above embodiments. Therefore, regarding the embodiments of each functional module of the acquiring device 300 of residual energy of a power battery, please refer to the embodiments of the corresponding method steps, which will not be repeated in the embodiment of the present application.

Figure 4:
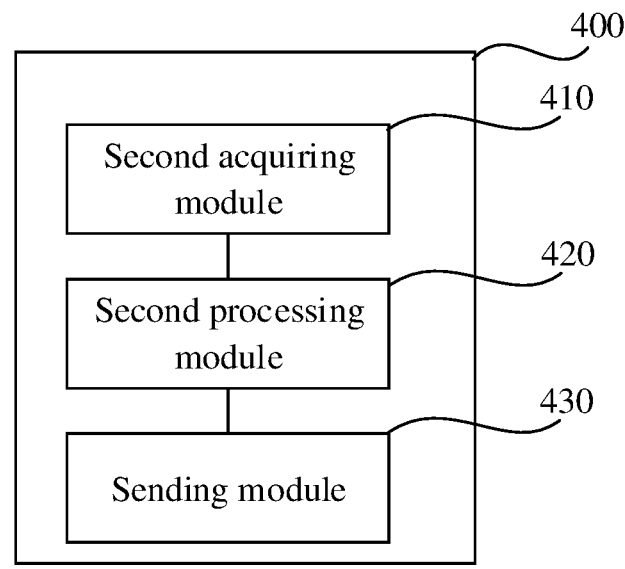
FIG. 4 is a structure diagram of a display device of energy disclosed by an embodiment of the present application.

Referring to FIG. 4, the embodiment of the present application also provides a display device 400 of energy, including a second acquiring module 410, a second processing module 420 and a sending module 430.

The second acquiring module 410 is used for acquiring residual energy of the power battery. The second processing module 420 is used for determining second displayed available energy in accordance with the residual energy and first displayed available energy. The first displayed available energy is displayed available energy of a current period, and the second displayed available energy is the displayed available energy of a next period. The sending module 430 is used for sending the second displayed available energy to a controller.

In the embodiment of the present application, the second processing module 420 is further used for determining the second displayed available energy in accordance with the residual energy, the first displayed available energy and the energy change rate.

In the embodiment of the present application, if the power battery is in a charging state within the current period, the second processing module 420 is specially used for:

if $Energy_1 + k_1*Energy_{rate} > Energy_{real}$,
$Energy_2 = Energy_1 + k_1*Energy_{rate}$; or, if $Energy_1 + k_2*Energy_{rate} < Energy_{real}$,
$Energy_2 = Energy_1 + k_2*Energy_{rate}$; or, if $Energy_1 + k_2*Energy_{rate} \geq Energy_{real}$,
$Energy_2 = Energy_{real}$;

where $Energy_1$ represents the first displayed available energy, $Energy_{rate}$ represents the energy change rate, $k_1 < 1$, $k_2 > 1$, $Energy_{real}$ represents the residual energy, and $Energy_2$ represents the second displayed available energy.

In the embodiment of the present application, if the power battery is in a discharging state within the current period, the second processing module 420 is specially used for:

if $Energy_1 - k_3*Energy_{rate} > Energy_{real}$,
$Energy_2 = Energy_1 - k_3*Energy_{rate}$; or, if $Energy_1 - k_4*Energy_{rate} < Energy_{real}$,
$Energy_2 = Energy_1 - k_4*Energy_{rate}$; or, if $Energy_1 - k_4*Energy_{rate} \geq Energy_{real}$,
$Energy_2 = Energy_{real}$;

where $Energy_1$ represents the first displayed available energy, $Energy_{rate}$ represents the energy change rate, $k_3 > 1$, $k_4 < 1$, $Energy_{real}$ represents the residual energy, and $Energy_2$ represents the second displayed available energy.

Each functional module of the display device 400 of energy as shown in FIG. 4 is in one-to-one correspondence to each step of the display method of energy as introduced in the above embodiments. Therefore, regarding the embodiments of each functional module of the display device 400 of energy, please refer to the embodiments of the corresponding method steps, which will not be repeated in the embodiment of the present application.

Figure 5:
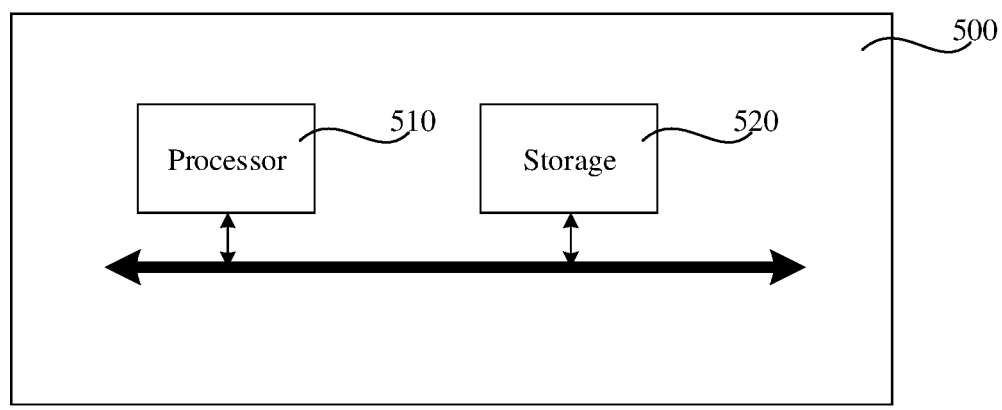
FIG. 5 is a schematic diagram of a battery management system disclosed by an embodiment of the present application.

Referring to FIG. 5, the embodiment of the present application also provides a battery management system 500, including a processor 510; and a storage 520 in communication connection with the processor 510, the storage 520 is stored with an instruction executable by the processor 510, the processor 510 executes the acquiring method of residual energy of a power battery or a display method of energy provided by the embodiment of the present application upon executing the instruction.

Where the processor 510 and the storage 520 are in directly or indirectly electric connection for achieving data transmission or interaction. For example, electric connection may be achieved among these elements through one or more communication buses or signal buses. The acquiring method of residual energy of power battery or the display method of energy respectively includes at least one software functional module stored in the storage 520 in a software or firmware form.

The processor 510 is an integrated circuit chip having a signal processing capability. The processor 510 may be a general-purpose processor including a CPU Centering Processing unit (CPU), an Network Processor (NP) and like. The processor 510 may be a digital signal processor, an Application Specific Integrated Circuit, a Field-Programmable Gate Array or other Programmable Logic Device, discrete gate or transistor logic devices, discrete hardware components. The processor is capable of achieving or implementing each method, step and logical block diagram disclosed in the embodiment of the present application. The general-purpose processor can be a microprocessor or it can be any generic processor, etc.

There may store various software programs and modules in the storage 520, e.g., the acquiring method and device of residual energy of a power battery provided by the embodiment of the present application or program instructions/modules corresponding to the display method and device of energy. By executing software programs and modules stored in the storage 520, the processor 510 executes various functional applications and data processing, that is, the technical solution of the embodiment of the present application is realized.

The storage 520 includes but is not limited to Random Access Memory (RAM), Read Only Memory (ROM), Programmable Read-Only Memory (PROM), Erasable Programmable Read-Only Memory (EPROM), Electric Erasable Programmable Read-Only Memory (EEPROM) or the like.

In the embodiment of the present application, there also provides an electric vehicle, including a power battery, a battery management system 500 as shown in FIG. 5, a vehicle control unit and basic structures or components of other electric vehicles.

In the embodiment of the present application, there also provides a readable storage medium. The readable storage medium is stored with an instruction. The processor executes the acquiring method of residual energy of a power battery or the display method of energy upon executing the instruction provided by the embodiment of the present application.

Although the present application has been described by referring to optimized embodiments, it would be appreciated to make various improvements and equivalent substitutions for components in the above embodiments without departing from the scope of the present application. In particular, all technical features mentioned in the above embodiments can be arbitrarily combined as long as there are no structure conflicts. The present application is not limited to the particular embodiments disclosed herein, but includes all technical solutions falling into the protection scope of its claims.

What is claimed is:

1. An acquiring method of residual energy of a power battery, the acquiring method comprising:
   acquiring an available capacity of a first type of cells and an available capacity of a second type of cells of the power battery, wherein the first type of cells and the second type of cells are made from different materials;
   determining a minimum available capacity of the available capacity of the first type of cells and the available capacity of the second type of cells as an available capacity of the power battery;
   determining available energy of the first type of cells in accordance with the available capacity of the power battery, a current temperature and a quantity of cells of the first type of cells;
   determining available energy of the second type of cells in accordance with the available capacity of the power battery, a current temperature and a quantity of cells of the second type of cells; and
   determining a sum of available energy of the first type of cells and available energy of the second type of cells as residual energy of the power battery.

2. The acquiring method according to claim 1, wherein the acquiring an available capacity of the first type of cells and an available capacity of the second type of cells comprises:
   acquiring an available capacity of a first cell, and acquiring an available capacity of a second cell; and
   acquiring an available capacity of a third cell, and acquiring an available capacity of a fourth cell,
   wherein the first cell is a cell with a minimum capacity within the first type of cells, the second cell is a cell with a minimum state of charge within the first type of cells; the third cell is a cell with a minimum capacity within the second type of cells; and the fourth cell is a cell with a minimum state of charge within the second type of cells.

3. The acquiring method according to claim 2, wherein the determining a minimum available capacity of the available capacity of the first type of cells and the available capacity of the second type of cells as an available capacity of the power battery comprises:
   determining a minimum available capacity among the available capacity of the first cell, the available capacity of the second cell, the available capacity of the third cell, and the available capacity of the fourth cell as the available capacity of the power battery.

4. The acquiring method according to claim 2, wherein the determining available energy of the first type of cells in accordance with the available capacity of the power battery, a current temperature and a quantity of cells of the first type of cells comprises:
   determining a use interval of the first cell and a use interval of the second cell respectively in accordance with the available capacity of the power battery, wherein the use interval is a use interval of a state of charge of a corresponding cell; and
   determining available energy of the first cell in accordance with the use interval of the first cell and the current temperature, and determining available energy of the second cell in accordance with the use interval of the second cell and the current temperature;
   determining available energy of the first type of cells in accordance with the available energy of the first cell, the available energy of the second cell and a quantity of cells of the first type of cells; and
   wherein the determining available energy of the second type of cells in accordance with the available capacity of the power battery, a current temperature and a quantity of cells of the second type of cells comprises:
   determining a use interval of the third cell and a use interval of the fourth cell respectively in accordance with the available capacity of the power battery;
   determining available energy of the third cell in accordance with the use interval of the third cell and the current temperature, and determining available energy of the fourth cell in accordance with the use interval of the fourth cell and the current temperature; and
   determining available energy of the second type of cells in accordance with the available energy of the third cell, the available energy of the fourth cell, and a quantity of cells of the second type of cells.

5. The acquiring method according to claim 4, wherein the determining available energy of the first type of cells in accordance with the available energy of the first cell, the available energy of the second cell and a quantity of cells of the first type of cells comprises:
   acquiring less available energy of the available energy of the first cell and the available energy of the second cell; and
   determining a product of the less available energy and a quantity of cells of the first type of cells as the available energy of the first type of cells; and

19 wherein the determining available energy of the second type of cells in accordance with the available energy of the third cell, the available energy of the fourth cell and a quantity of cells of the second type of cells comprises:
acquiring less available energy of the available energy of the third cell and the available energy of the fourth cell; and
determining a product of the less available energy and a quantity of cells of the second type of cells as the available energy of the second type of cells.

6. The acquiring method according to claim 1, the method further comprising:
determining second displayed available energy in accordance with the residual energy and first displayed available energy, wherein the first displayed available energy is displayed available energy of a current period, and the second displayed available energy is displayed available energy of a next period; and sending the second displayed available energy to a controller.

7. The acquiring method according to claim 6, wherein the determining second displayed available energy in accordance with the residual energy and first displayed available energy comprises:
determining second displayed available energy in accordance with the residual energy, the first displayed available energy and an energy change rate.

8. The acquiring method according to claim 7, wherein under the condition that the power battery is in a charging state within the current period, the determining second displayed available energy in accordance with the residual energy, the first displayed available energy and an energy change rate comprises:

if $Energy_1 + k_1 * Energy_{rate} > Energy_{real}$,
$Energy_2 = Energy_1 + k_1 * Energy_{rate}$; or, if $Energy_1 + k_2 * Energy_{rate} < Energy_{real}$,
$Energy_2 = Energy_1 + k_2 * Energy_{rate}$; or, if $Energy_1 + k_2 * Energy_{rate} \geq Energy_{real}$,
$Energy_2 = Energy_{real}$;

wherein $Energy_1$ represents the first displayed available energy, $Energy_{rate}$ represents the energy change rate, $k_1 < 1$, $k_2 > 1$, $Energy_{real}$ represent the residual energy, and $Energy_2$ represents the second displayed available energy.

9. The acquiring method according to claim 7, wherein under the condition that the power battery is in a discharging state within the current period, the determining second displayed available energy in accordance with the residual energy, the first displayed available energy and an energy change rate comprises:

if $Energy_1 - k_3 * Energy_{rate} > Energy_{real}$,
$Energy_2 = Energy_1 - k_3 * Energy_{rate}$; or, if $Energy_1 - k_4 * Energy_{rate} < Energy_{real}$,
$Energy_2 = Energy_1 - k_4 * Energy_{rate}$; or, if $Energy_1 - k_4 * Energy_{rate} \geq Energy_{real}$,
$Energy_2 = Energy_{real}$;

wherein $Energy_1$ represents the first displayed available energy, $Energy_{rate}$ represents the energy change rate, $k_3 > 1$, $k_4 < 1$, $Energy_{real}$ represent the residual energy, and $Energy_2$ represents the second displayed available energy.

10. An acquiring device of residual energy of a power battery, the acquiring device comprising:

20 an acquiring module configured to acquire an available capacity of a first type of cells and an available capacity of a second type of cells of the power battery, wherein the first type of cells and the second type of cells are made from different materials; and
a processing module configured to determine a minimum available capacity of the available capacity of the first type of cells and the available capacity of the second type of cells as an available capacity of the power battery, determine available energy of the first type of cells in accordance with the available capacity of the power battery, a current temperature and a quantity of cells of the first type of cells, determine available energy of the second type of cells in accordance with the available capacity of the power battery, a current temperature and a quantity of cells of the second type of cells, and determine a sum of the available energy of the first type of cells and the available energy of the second type of cells as residual energy of the power battery.

11. The acquiring device according to claim 10, wherein the acquiring module is specially configured to:
acquire an available capacity of a first cell and acquire an available capacity of a second cell, and acquire an available capacity of a third cell and acquire an available capacity of a fourth cell;
wherein the first cell is a cell with a minimum capacity within the first type of cells; the second cell is a cell with a minimum state of charge within the first type of cells, the third cell is a cell with a minimum capacity of the second type of cells, and the fourth cell is a cell with a minimum state of charge within the second type of cells.

12. The acquiring device according to claim 11, wherein the processing module is specially configured to:
determine a minimum available capacity among the available capacity of the first cell, the available capacity of the second cell, the available capacity of the third cell and the available capacity of the fourth cell as an available capacity of the power battery.

13. The acquiring device according to a claim 11, wherein the processing module is further specially configured to:
determine a use interval of the first cell and a use interval of the second cell respectively in accordance with the available capacity of the power battery, wherein the use interval is a use interval of a state of charge of a corresponding cell,
determine available energy of the first cell in accordance with the use interval of the first cell and the current temperature and determine available energy of the second cell in accordance with the use interval of the second cell and the current temperature,
determine the available energy of the first type of cells in accordance with the available energy of the first cell, the available energy of the second cell and the quantity of the cells of the first type of cell; and
wherein the processing module is further specially configured to:
determine a use interval of the third cell and a use interval of the fourth cell respectively in accordance with the available capacity of the power battery,
determine available energy of the third cell in accordance with the use interval of the third cell and the current temperature, and determine available energy of the fourth cell in accordance with the use interval of the fourth cell and the current temperature, and determine the available energy of the second type of cells in accordance with the available energy of the third cell, the available energy of the fourth cell and the quantity of the cells of the second type of cells.

14. The acquiring device according to claim 13, wherein the processing module is further specially configured to:
   acquire less available energy of the available energy of the first cell and the available energy of the second cell,
   determine a product of the less available energy and the quantity of cells of the first type of cells as the available energy of the first type of cells; and
   wherein the processing module is further specially configured to:
   acquire less available energy of the available energy of the third cell and the available energy of the fourth cell, and
   determine a product of the less available energy and the quantity of cells of the second type of cells as the available energy of the second type of cells.

15. The acquiring device according to claim 10, wherein the processing module is further configured to:
   determine second displayed available energy in accordance with the residual energy and first displayed available energy, wherein the first displayed available energy is displayed available energy of a current period; and the second displayed available energy is displayed available energy of a next period; and sending the second displayed available energy to a controller.

16. The acquiring device according to claim 15, wherein the processing module is specially configured to:
   determine the second displayed available energy in accordance with the residual energy, the first displayed available energy and an energy change rate.

17. The acquiring device according to claim 16, wherein under the condition that the power battery is in a charging state within the current period, the processing module is specially configured to:

if $Energy_1 + k_1 * Energy_{rate} > Energy_{real}$,
   $Energy_2 = Energy_1 + k_1 * Energy_{rate}$; or, if $Energy_1 + k_2 * Energy_{rate} < Energy_{real}$,
   $Energy_2 = Energy_1 + k_2 * Energy_{rate}$; or, if $Energy_1 + k_2 * Energy_{rate} \geq Energy_{real}$,
   $Energy_2 = Energy_{real}$;

wherein $Energy_1$ represents the first displayed available energy, $Energy_{rate}$ represents the energy change rate, $k_1 < 1$, $k_2 > 1$, $Energy_{real}$ represent the residual energy, and $Energy_2$ represents the second displayed available energy.

18. The acquiring device according to claim 16, wherein under the condition that the power battery is in a discharging state within the current period, the processing module is specially configured to:

if $Energy_1 - k_3 * Energy_{rate} > Energy_{real}$,
   $Energy_2 = Energy_1 - k_3 * Energy_{rate}$; or, if $Energy_1 - k_4 * Energy_{rate} < Energy_{real}$,
   $Energy_2 = Energy_1 - k_4 * Energy_{rate}$; or, if $Energy_1 - k_4 * Energy_{rate} \geq Energy_{real}$,
   $Energy_2 = Energy_{real}$;

wherein $Energy_1$ represents the first displayed available energy, $Energy_{rate}$ represents the energy change rate, $k_3 > 1$, $k_4 < 1$, $Energy_{real}$ represent the residual energy, and $Energy_2$ represents the second displayed available energy.

* * * * *